United States Patent [19]

Nakamura et al.

[11] 4,040,075

[45] Aug. 2, 1977

[54] FREQUENCY CONVERTER

[75] Inventors: Hideo Nakamura, Komae; Mitsuo Ohsawa, Fujisawa; Osamu Hamada, Tokyo, all of Japan

[73] Assignee: Sony Corporation, Tokyo, Japan

[21] Appl. No.: 571,784

[22] Filed: Apr. 25, 1975

[30] Foreign Application Priority Data

May 9, 1974 Japan .................................. 49-51569

[51] Int. Cl.² ........................................... H01L 29/78
[52] U.S. Cl. ...................................... 357/23; 357/34;
357/89; 307/273; 307/304; 328/20; 331/52;
331/53
[58] Field of Search ............................ 357/23, 89, 34;
307/273, 304; 328/20; 331/52, 53

[56] References Cited

U.S. PATENT DOCUMENTS

| 3,204,160 | 8/1965 | Sah | 357/23 |
| 3,289,009 | 11/1966 | Gruodis | 357/23 |
| 3,335,290 | 8/1967 | Fischman et al. | 328/20 |
| 3,397,326 | 8/1968 | Gallagher et al. | 357/43 |
| 3,398,297 | 8/1968 | Huen | 328/20 |
| 3,639,853 | 2/1972 | Sakai | 331/52 |
| 3,663,869 | 5/1972 | Strull | 357/43 |

FOREIGN PATENT DOCUMENTS 906,036 9/1962 United Kingdom .................. 357/89

Primary Examiner—Michael J. Lynch
Assistant Examiner—Joseph E. Clawson, Jr.
Attorney, Agent, or Firm—Hill, Gross, Simpson, Van Santen, Steadman, Chiara & Simpson

[57] ABSTRACT

A frequency converter utilizing a novel four terminal semiconductor device having an emitter grounded current amplification characteristic which is V-shaped wherein the gate terminal of the four terminal device is biased to the low point of the emitter grounded current amplification characteristic and wherein a signal which varies in time is applied to the gate terminal to cause the emitter grounded current amplification factor to fluctuate at both sides of its low point. A tuning circuit is provided in series with the emitter-collector terminals of the four terminal device and is tuned to twice the frequency of the input signal applied to the gate terminal.

9 Claims, 10 Drawing Figures

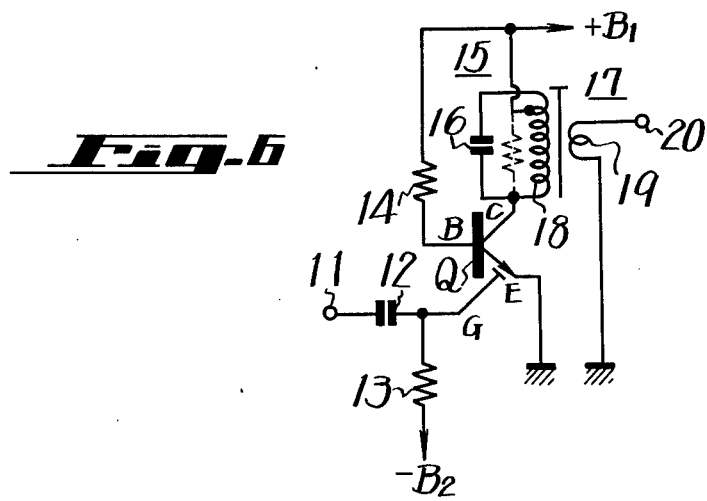
Fig. 6
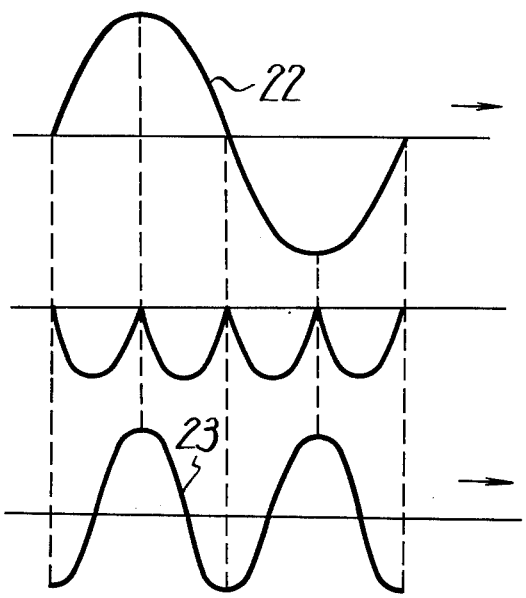
Fig. 7A
Fig. 7C
Fig. 7B
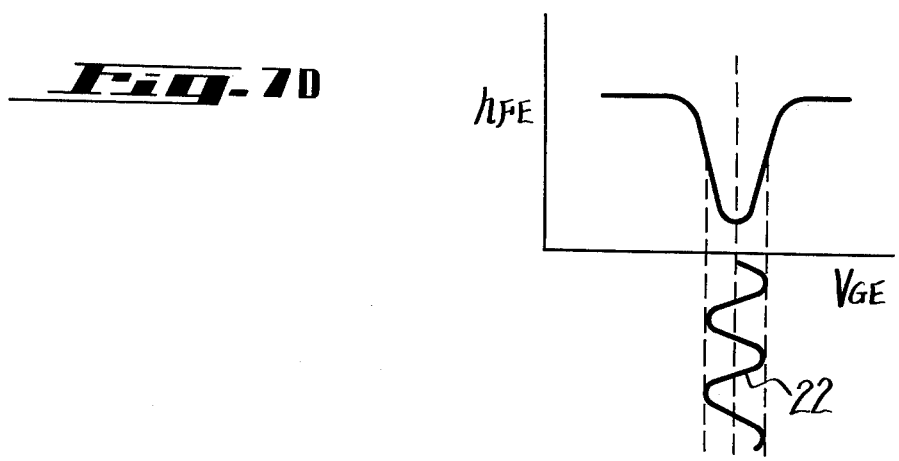
Fig. 7D

FREQUENCY CONVERTER

BACKGROUND OF THE INVENTION

Field of the Invention

The field of art to which this invention pertains is frequency converting circuits and in particular to circuits for producing an output signal having a frequency which is a multiple of the frequency of the circuit input signal.

SUMMARY OF THE INVENTION

It is the principle feature of the present invention to provide an improved frequency converting circuit.

It is another feature of the present invention to provide a frequency converting circuit using a normal four terminal semiconductor device.

It is a principle object of the present invention to provide a frequency converting circuit as described above, wherein an input signal is applied to the gate of a four terminal semiconductor device, wherein the semiconductor device has an emitter grounded current amplification characteristic which is generally V-shaped and wherein a bias is applied to the gate to establish the operating point at the low point of the characteristic.

Another object of the present invention is to provide a frequency converting circuit of the type described above wherein a tuning circuit is provided is series with the collector to emitter of the four terminal semiconductor device and the tuning circuit is tuned to a multiple of the frequency of the input signal.

It is also an object of the present invention to provide a circuit as described above wherein the tuning circuit includes an inductor which also acts as a primary coil of an output transformer and wherein the secondary of the output transformer has one of its terminals grounded with the output signal derived from the other terminal.

These and other objects, features and advantages of the present invention will be understood in greater detail from the following description on the sole sheet of drawings wherever numerals are utilized to designate a preferred embodiment.

BRIEF DESCRIPTION OF THE DRAWINGS

FIG. 6 is a schematic of the frequency converter circuit of the present invention.

FIGS. 7A, 7B, 7C and 7D are waveforms used to describe the functions of the circuit of FIG. 6.

DESCRIPTION OF THE PREFERRED EMBODIMENT

The present invention relates to a frequency converting circuit and the embodiment to be described herein relates to a frequency doubler using a novel four terminal semiconductor device with a special emitter grounded current amplification characteristic curve.

Figure 1:
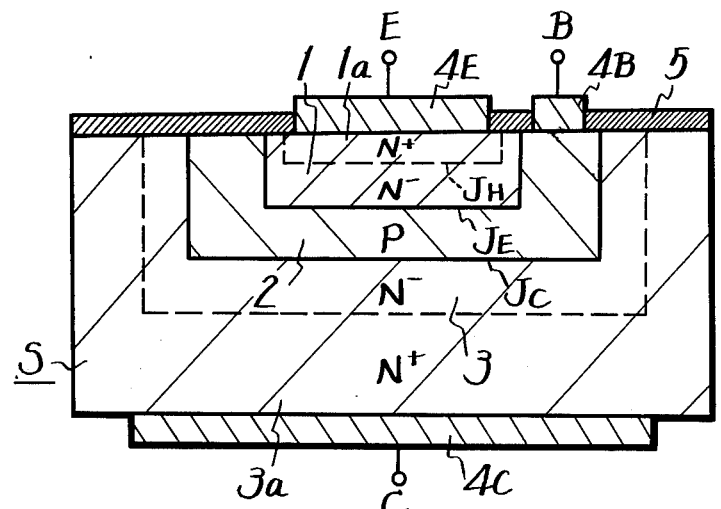
FIG. 1 is a schematic of a three terminal semiconductor device which forms the basis for the four terminal semiconductor device of FIG. 3.
Figure 2:
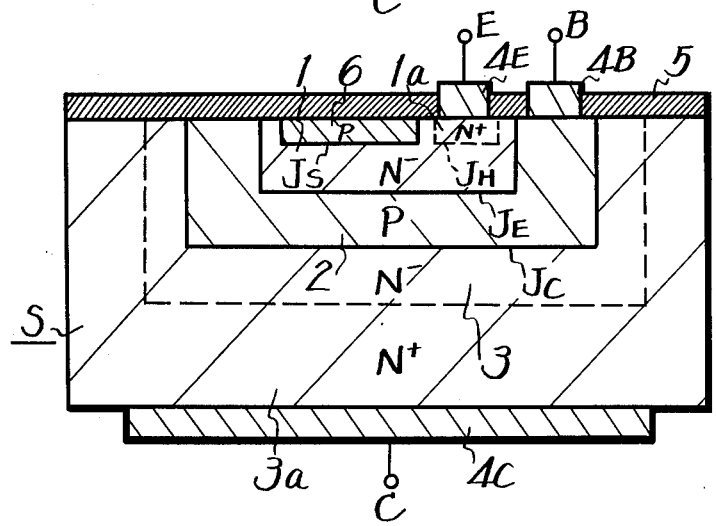
FIG. 2 is a further embodiment of a three terminal device which may be the basis for a four terminal device which is usable in the present invention.
Figure 3:
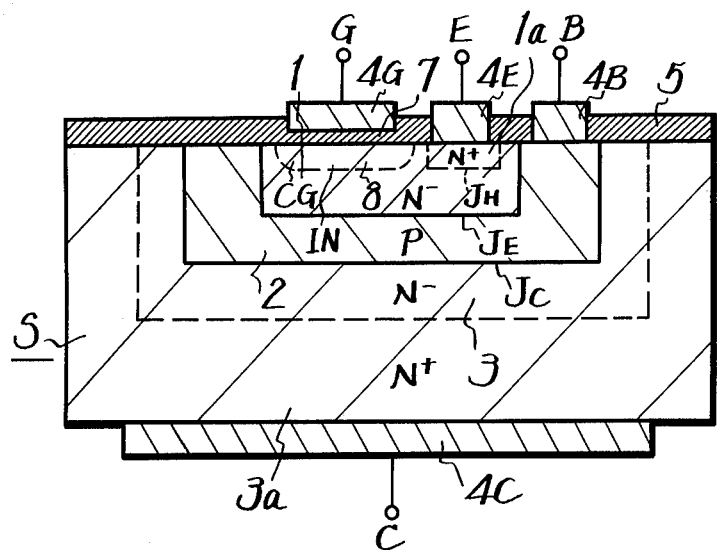
FIG. 3 is an illustration of a four terminal device of the type used in the circuit of FIG. 6.

The semiconductor devices of FIGS. 1, 2 and 3 are high in current amplification factor, good in saturation characteristic and low in noise as compared with a prior art bipolar transistor and is constituted by providing a fourth electrode additionally to a body of a novel semiconductor device of the three terminal type described below.

Before describing the present invention, an embodiment of the novel semiconductor device of the three terminal type or bipolar transistor will be now described.

The emitter grounded current amplification factor $h_{FE}$ of a transistor, which is one of parameters evaluating the characteristics of the bipolar transistor, can be expressed by the following equation (1), if the base grounded current amplification factor of the transistor is taken as $\alpha$.

$$h_{FE} = \frac{\alpha}{1 - \alpha} \tag{1}$$

The factor $\alpha$ is expressed as follows:

$$\alpha = \alpha^* \beta \gamma \tag{2}$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \tag{3}$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{qD_n n_p}{L_n} \left( \exp\left(\frac{qV}{kT}\right) - 1 \right) \tag{4}$$

$$J_p = \frac{qD_p p_n}{L_p} - \left( \exp\left(\frac{V}{kT}\right) - 1 \right) \tag{5}$$

the ratio $\delta$ of $J_n$ and $J_p$ is expressed as follows:

$$\delta = \frac{J_p L_n D_p}{J_n L_p D_n} \cdot \frac{p_n}{n_p} \quad (6)$$

wherein $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carriers in the emitter under the equilibrium state; $V$ a voltage applied to the emitter junction of the transistor; $k$ the Boltzmann's constant; $T$ temperature and $q$ the absolute value of electron charge.

It it is assumed that the impurity concentration in the emitter of the transistor is taken as $N_D$ and that in the base of the transistor taken as $N_A$, the term $pn/n_p$ can be replaced by the term $N_A/N_D$. Further, since $L_n$ is restricted by the base width W and $L_n = W$, the ratio $\delta$ is expressed as follows:

$$\delta = \frac{W}{L_p} \cdot \frac{D_p}{D_n} \cdot \frac{N_A}{N_D} \quad (7)$$

The diffusion constants $D_n$ and $D_p$ are functions of transfer of the carrier and temperature and in this case they are assumed constant substantially.

As may be obvious from the above respective equations, in order to increase the current amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atom/cm³, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = \sqrt{D_p \tau_p} \quad (8)$$

the diffusion distance $L_p$ of the minority carriers or holes becomes short. Therefore, as may be apparent from the equation (7), $\delta$ can not be made small so much and hence the injection efficiency $\gamma$ can not be made high over a certain value. As a result, the current amplification factor $h_{FE}$ can not be made high so much in the ordinary transistor.

The novel three terminal semiconductor device is free from the defects mentioned just above inherent to the prior art transistor. As the semiconductor device used in this invention, an NPN-type one and a PNP-type one could be considered as in the case of the prior art transistor, but an NPN-type semiconductor device will be now described with reference to FIGS. 1 and 2, by way of example.

As shown in FIG. 1, the NPN-type three terminal semiconductor device consists of a first semiconductor region 1 of N type conductivity formed in a semiconductor substrate S of N+ type conductivity, a second semiconductor region 2 of P type conductivity formed in the semiconductor substrate S adjacent the first region 1, and a third semiconductor region 3 of N− type conductivity formed in the substrate S adjacent the second region 2 to form a first PN-junction $J_E$ between the first and second regions 1 and 2 and a second PN-junction $J_c$ between the second and third regions 2 and 3, respectively.

With the semiconductor device shown in FIG. 1, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, or at least heat energy is formed in the first region 1. In the example of FIG. 1, the impurity concentration in the first region 1 is selected low sufficiently such as in the order of $10^{15}$ atoms/cm³ and region 1a of N+ type conductivity or the impurity concentration of about $10^{19}$ atom/cm³ is formed in the first region 1 to form an LH-junction and hence to form the barrier.

The impurity concentration in the second region 2 is selected in the order of $10^{15}$–$10^{17}$ atom/cm³ and that in the third region 3 is selected sufficiently low such as in the order of $10^{15}$ atom/cm³.

In the semiconductor substrate S adjacent to the third region 3 but apart from the second junction $J_c$, there is formed a region 3a of N+ type conductivity and with the impurity concentration of about $10^{19}$ atom/cm³.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith, respectively. From these electrodes 4E, 4B and 4C there are led out first, second and third terminals E, B, and C, respectively. In FIG. 1, reference numeral 5 indicates an insulating layer made of, for example, SiO₂ and formed on the surface of the substrate S.

The semiconductor device shown in FIG. 1 can be used as a transistor. In such a case, the first region 1 serves as an emitter region; the second region 2 as a base region; and the third region 3 as a collector region, respectively, a forward bias is applied to the emitter junction $J_3$ and a reverse bias is applied to the collector junction $J_C$.

Thus, the holes injected from the base or the second region 2 to the emitter or first region 1 have a long life period of time due to the fact that the emitter region 1 has the low impurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate S and may be recombined with electrons on the surface in practice, the diffusion distance $L_p$ could not be made long substantially. With the semiconductor device shown in FIG. 1, since the potential barrier is formed in the emitter region 1, which potential barrier faces the emitter junction $J_E$, at the position with a distance smaller than the diffusion distance $L_p$ of the minority carrier, the amount of the surface-recombination is reduced and the diffusion distance $L_p$ can be taken long sufficiently.

Due to the fact that the potential barrier is formed as described above in the example shown in FIG. 1, there is performed such an effect that the current density or component $J_p$ of the holes injected from the base region 2 to the emitter region 1 is reduced. That is, on the LH-junction $J_H$ in the emitter region 1, there is caused a false Fermi level difference or built-in electric field which acts to suppress the diffusion of the holes or the minority carrier. Therefore, if the level of the Fermi level is sufficiently high, the diffusion current caused by the concentration gradient of holes and the drift current caused by the built-in electric field are cancelled on the LH-junction with each other to reduce the hole current $J_p$ injected from the base 2 through the emitter region 1 of low impurity concentration. By this effect, the ratio of electron current arriving at the collector region 3 relative to current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as $kT$ but the above level difference is desired to be more than 0.1 eV. With in the transition region of the potential, the diffusion distance $L_p$ of the holes must be not terminated within the transition region, or it is required that the diffusion distance $L_p$ of the hole must be greater than the width of the transition region.

In the case that LH-junction $J_H$ is formed as shown in FIG. 1, the potential barrier of 0.2 eV can be formed by suitably selecting the amount of impurity and gradient of the high impurity concentration region 1a.

FIG. 2 shows another example of the three terminal semiconductor device in which reference numerals and letters same as those used in FIG. 1 indicate the same element so that their description will be omitted.

In the example of FIG. 2, in order to form a PN-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_p$ of the minority carrier in the first region 1. In the example of FIG. 2, the distance between the junctions $J_S$ and $J_E$ is selected smaller than the diffusion distance $L_p$ of the minority carrier in the first region 1. The other construction of the example shown in FIG. 2 is substantially same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from electrical point of view, its potential is increased as the number of holes arriving at the additional region 6 is increased. Thus, the PN junction $J_S$ formed between the regions 6 and 1 is biased forwardly to its rising-up voltage substantially, and then holes will be re-injected to the first region 1 from the additional region 6. Thus, the concentration of holes in the first region 1 near the additional region 6 will be increased, and accordingly the concentration distribution of holes between the junctions $J_E$ and $J_S$ in the first region 1 is made uniform and the gradient thereof becomes gradual to reduce the diffusion current $J_p$ from the second region 2 to the first region 1.

If, in the semiconductor devices described above, a fourth region or control region is formed in the first region 1 thereof and a fourth electrode or control electrode (gate) is connected thereto so as to form a novel four terminal semiconductor device, its current amplification factor may be varied by applying a control voltage to the control electrode (gate).

A description will be now given on the novel four terminal semiconductor device which is suitable for use in the invention with reference to FIG. 3 in which a control electrode (gate) is formed on a surface of a part (semiconductor control region) of the first semiconductor region 1 (emitter region) of the semiconductor device of the three terminal type shown in FIG. 1 through an insulating layer. Therefore, in FIG. 3, elements corresponding to those of FIG. 1 are shown by the same reference numerals and letters and their description will be omitted for the sake of brevity.

In the embodiment of FIG. 3, a control electrode 4G such as a metal layer made of, for example, aluminum and having a predetermined area is formed on a part of the first semiconductor region (emitter region) 1 of the device shown in FIG. 1 through an insulating layer (gate insulating layer) 7 which has a predetermined thickness, for example, 100 A (angstrom), and is made of, for example, $S_iO_2$ similar to the insulating layer 5, and corresponds to the gate insulating layer of a MOS FET. A gate terminal G is led out from the control electrode 4G as a fourth terminal. A part 8 in the first region 1 opposing the control electrode 4G is the semiconductor control region.

If a gate bias voltage is applied between the gate and emitter of the four terminal semiconductor device or the gate terminal G and the emitter terminal E, the current amplification factor or emitter-grounded current amplification factor $h_{FE}$ thereof is varied in response to the gate bias voltage along a curve which is convex in the downward direction and substantially symmetrical with respect to its minimum value. In other words, if a bias voltage which is negative relative to the emitter terminal E in the device of FIG. 3, within the positive range from the threshold voltage of the bias voltage, a storage layer CG having the function similar to the LH-junction $J_H$ as the potential barrier in FIG. 1 is formed in a part of the first region (emitter region) 1 as the voltage approaches the positive direction. Thus, the current density $J_p$ of the holes of the diffusion current from the second region (base region) 2 to the first region (emitter region) 1 decreases, and consequently the factor $h_{FE}$ increases.

While, within the negative region from the threshold voltage of the bias voltage, an inverse layer IN is formed in a part of the emitter region 1 or control region 8 as the voltage approaches the negative direction and, similar to the case where the additional region 6 in FIG. 2 is floated in electrical point of view, holes are re-injected from the inverse layer IN to the emitter region 1. Thus, the current density $J_p$ of the holes of the diffusion current from the base region 2 to the emitter region 1 decreases, and consequently the factor $h_{FE}$ increases.

Figure 4:
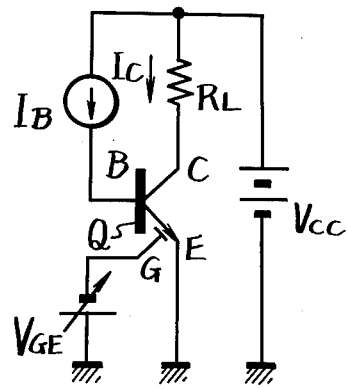
FIG. 4 is a test circuit which is utilizable in developing the emitter grounded current amplification characteristic or factor shown in FIG. 5.
Figure 5:
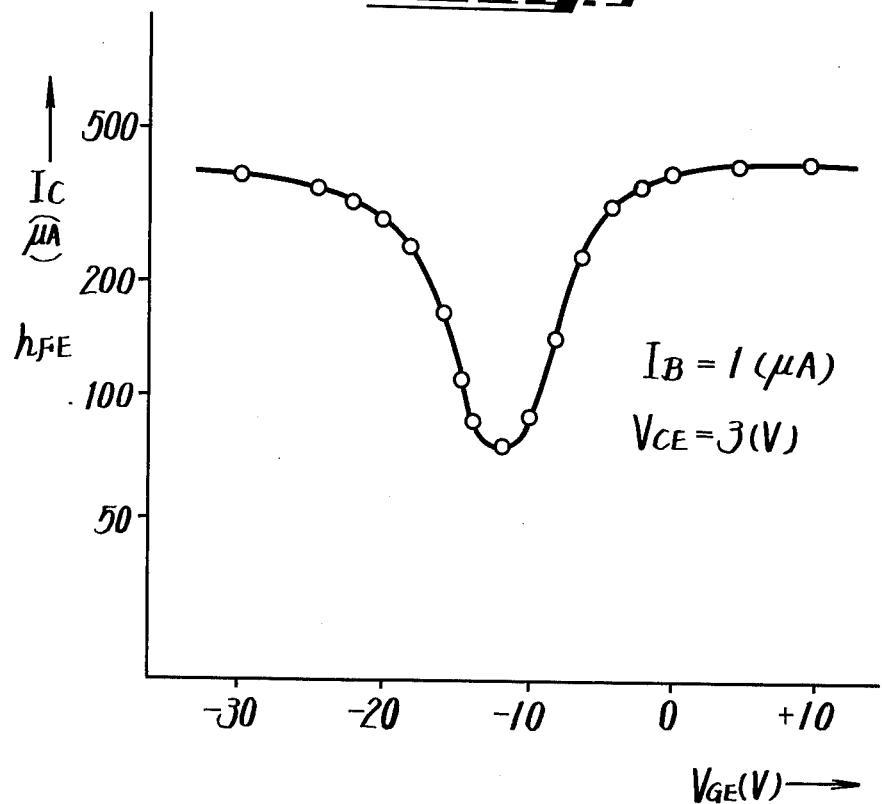
FIG. 5 is the emitter grounded current amplification characteristic or factor of the four terminal device of the present invention as developed by varying the gate to emitter bias in the circuit of FIG. 4.

FIG. 5 is a graph showing the characteristics of the novel four terminal semiconductor device shown in FIG. 3 which is measured by a measuring circuit shown in FIG. 4.

In FIG. 4, reference letter Q indicates the novel four terminal semiconductor device shown in FIG. 3 as a symbol, in which a short line is added to the symbol of the prior art bipolar transistor in parallel to its emitter as the gate of the novel four terminal semiconductor device Q. In FIG. 4, the novel four terminal semiconductor device Q is shown as an emitter-grounded type. In the figure, reference letter $R_L$ indicates a collector load resistor of the device Q, $V_{CC}$ its collector voltage source, $I_C$ its collector current, $I_B$ its base current (constant), and $V_{GE}$ its gate-emitter voltage, respectively.

When its collector-emitter voltage $V_{CE}$ is 3V (volts) and the base current $I_B$ is $1\mu$ A (micro-ampere), the characteristics of the gate-emitter voltage (gate bias voltage) $V_{GE}$(V) - collector current $I_C$ ($\mu$A) and emitter-grounded current amplification factor $h_{FE}$ are shown in the graph of FIG. 5.

According to the characteristic curve of FIG. 5, it may be understood that the current amplification factor $h_{FE}$ is varied in response to the variation of the gate bias voltage along a curve which is convex in the downward direction and approximately symmetrical with respect to its minimum value (where the gate-emitter voltage is at the above threshold voltage).

When the thickness of the emitter region 1 of the semiconductor device shown in FIG. 3 is selected smaller than the diffusion distance $L_p$ of the holes (injected carriers), the surface recombination, where the gate-emitter voltage $V_{GE}$ is substantially equal to the threshold voltage, influences much. Thus, the life time period of the injected carrier (minority carrier) becomes short, and accordingly the minimum value of the factor $h_{FE}$ can be made small further.

The embodiment shown in FIG. 3 is an NPN type element, but it may be, of course, possible that the semiconductor device is made as a PNP type one as in the case of a bipolar transistor.

The frequency doubling circuit of the present invention is shown in FIG. 6. In that figure, a four terminal semiconductor device, according to the present invention, is designated by Q. The device has base, collector, emitter and gate terminals respectively. A power supply is connected from B+ circuit point through a resistor 14 to the base, and through a tuned circuit, which consists of the inductor 18 and a capacitor 16, to the collector. In this case, the emitter is grounded, and an output transformer is provided by the combination of the inductor 18 which acts as a primary for the transformer and a secondary 19. The output signal is derived at a terminal 20 of the secondary 19, while the other terminal of the secondary 19 is grounded as shown. An input signal is applied to a terminal 11 through a capacitor 12 directly to the gate, and a negative bias is applied through a resistor 13 to the gate as well.

FIG. 7A shows the input signal applied to the terminal 11. FIG. 7B shows an output signal derived at the terminal 20 of the secondary winding 19.

FIG. 7C shows a voltage obtainable at the collector of the semiconductor device Q if a hypothetical test resistor were connected in place of the tuned circuit as shown in dashed lines in the drawing.

FIG. 7D shows the emitter grounded current amplification characteristic of the semiconductor device Q with the DC bias level being established at the low point and with the input signal 22 being caused to fluctuate about the DC bias level to produce variations in the emitter grounded current amplification factor about the low point. By following the signal 22 carefully, it can be seen that for each half cycle of the signal 22, the current amplification factor is caused to increase and decrease through a complete cycle. Accordingly, for each full cycle of the input signal, variations in the current amplification factor are caused to pass through two full cycles. This is illustrated in FIG. 7C, where it can be seen that the waveform at the collector of Q is caused to repeat itself one full cycle for each half cycle of the input signal. When a tuned circuit is used in place of the resistor shown by the dashed lines, the output signal then appears as a sinusoid as shown in FIG. 7B.

We claim as our invention:

1. A frequency converter comprising:
   a semiconductor device having a first semiconductor region of one conductivity type,
   a second semiconductor region of the opposite conductivity type adjacent said first region with a first semiconductor junction therebetween,
   a third semiconductor region of the same conductivity type of said first region adjacent said second region with a second semiconductor junction therebetween, first, second and third terminals coupled to said first, second and third regions, respectively;
   a fourth terminal connected to said semiconductor device comprising a gate electrode formed over said first semiconductor region only at a position which is spaced from the said first terminal, and an insulating layer separating said fourth terminal from said first region, the vertical thickness of said first region between said insulating layer and first junction being less than a diffusion length of minority carriers therein,
   said semiconductor device having an emitter grounded current amplification (hfe) variation in response to changes in voltage between said first and fourth terminals, said variation exhibiting a minimum value at a first voltage between said first and fourth terminals and an increasing value for voltages higher and lower than said first voltage to form an amplification characteristic curve with substantially symmetrical increasing portions on either side of said minimum value;
   input signal means for applying a time varying signal at a first frequency to said fourth terminal,
   means for applying a predetermined bias to said fourth terminal to establish said first voltage between said first and fourth terminals;
   additional bias means connected to said second terminal for biasing said device into a conducting condition,
   means connected to said fourth terminal and input signal means for causing said time varying signal to increase and decrease about said predetermined bias at said fourth terminal to shift the amplification characteristic curve to said increasing portions on either side of said minimum value;
   and means connected to said third terminal for deriving an output at a frequency which is at least twice the value of the frequency of said time varying signal.

2. A device in accordance with claim 1, wherein said means for causing said time varying signal to increase and decrease about said predetermined bias comprises a capacitor connected in series between said input signal means and said fourth terminal with said predetermined bias being connected to a circuit point between said capacitor and said fourth terminal.

3. A device in accordance with claim 1 wherein said means for deriving an output comprises a tuned circuit being disposed to be energy coupled to the signal developed at the third terminal of said device.

4. A device in accordance with claim 3 wherein said tuned circuit is coupled in series with said third terminal.

5. A device in accordance with claim 4 wherein said tuned circuit is tuned to twice the frequency of said time varying signal.

6. A device in accordance with claim 4 wherein said tuned circuit comprises a parallel combination of an inductor and a capacitor and wherein an output transformer is provided with said inductor comprising the primary thereof and the secondary thereof has one terminal grounded with an output being derived from its other terminal.

7. A device in accordance with claim 1, wherein said first and third regions of the semiconductor device each have at least a first portion with concentrations of substantially the same order of magnitude and said first region being provided with a second portion having an impurity concentration higher than said first portion of the first region at a position spaced from said first junction by a distance which is smaller than the diffusion distance of the minority carriers.

8. A device according to claim 1, in which said fourth terminal comprises a gate electrode over said first semiconductor region only, an induced region being created in said first region adjacent said gate electrode in response to said predetermined bias and time varying signal, said induced region being spaced from said first semiconductor junction by a distance less than the diffusion length of minority carriers in said first region.

9. A frequency converter comprising:
a semiconductor device having a first semiconductor region of one conductivity type,
a second semiconductor region of the opposite conductivity type adjacent said first region with a first semiconductor junction therebetween,
a third semiconductor region of the same conductivity type of said first region adjacent said second region with a second semiconductor junction therebetween, first, second and third terminals coupled to said first, second and third regions, respectively;
a fourth terminal connected to said semiconductor device and having at least a portion thereof located over said first region at a position which is spaced from the said first terminal, and an insulating layer separating said fourth terminal from said first region, the vertical thickness of said first region between said insulating layer and first junction being less than a diffusion length of minority carriers therein,
said semiconductor device having an emitter grounded current amplification (hfe) variation in response to changes in voltage between said first and fourth terminals, said variation exhibiting a minimum value at a first voltage between said first and fourth terminals and an increasing value for voltages higher and lower than said first voltage to form an amplification characteristic curve with substantially symmetrical increasing portions on either side of said minimum value;
input signal means for applying a time varying signal at a first frequency to said fourth terminal,
means for applying a predetermined bias to said fourth terminal to establish said first voltage between said first and fourth terminals;
additional bias means connected to said second terminal for biasing said device into a conducting condition,
means connected to said fourth terminal and input signal means for causing said time varying signal to increase and decrease about said predetermined bias at said fourth terminal to shift the amplification characteristic curve to said increasing portions on either side of said minimum value;
and means connected to said third terminal for deriving an output at a frequency which is at least twice the value of the frequency of said time varying signal.

* * * * *